United States Patent
Wyant

(10) Patent No.: US 7,651,925 B2
(45) Date of Patent: Jan. 26, 2010

(54) VACUUM EXPANSION OF INTEGRATED CIRCUITS AT SORT

(75) Inventor: M. Todd Wyant, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 308 days.

(21) Appl. No.: 11/712,717

(22) Filed: Mar. 1, 2007

(65) Prior Publication Data
US 2008/0213977 A1 Sep. 4, 2008

(51) Int. Cl.
*H01L 21/00* (2006.01)
(52) U.S. Cl. .................. 438/464; 438/462; 438/460; 257/E21.599; 414/225.01; 414/935; 414/940; 414/941
(58) Field of Classification Search ................ 438/464, 438/462, 460; 257/E21.599; 414/255.01, 414/935, 940–941
See application file for complete search history.

(56) References Cited

U.S. PATENT DOCUMENTS

| | | | |
|---|---|---|---|
| 6,117,707 A | 9/2000 | Badehi | |
| 6,121,118 A | 9/2000 | Jin et al. | |
| 6,225,194 B1 | 5/2001 | Noguchi et al. | |
| 6,245,646 B1 | 6/2001 | Roberts | |
| 6,253,758 B1 * | 7/2001 | Wark et al. | 125/35 |
| 6,344,402 B1 | 2/2002 | Sekiya | |
| 6,426,275 B1 | 7/2002 | Arisa | |
| 6,451,671 B1 | 9/2002 | Yamada | |
| 2005/0064683 A1 | 3/2005 | Farnworth et al. | |

* cited by examiner

*Primary Examiner*—Davienne Monbleau
*Assistant Examiner*—Hajar Kohahdouzan
(74) *Attorney, Agent, or Firm*—Jimmy L. Funke

(57) ABSTRACT

A frame and vacuum expansion chuck are used in combination for stretching a tape carrying a plurality of singulated devices to facilitate removal of the devices with reduced risk of contact between a device being removed from the tape and an adjacent device on the tape. The combination includes a frame for holding edges of a tape carrying a plurality of singulated devices, and a vacuum chuck having upper surfaces for contacting an underside of a tape carrying a plurality of singulated devices. The vacuum chuck extends along a perimeter circumscribing the singulated devices, and at least one groove is defined in the upper surface of the vacuum chuck. Conduit for providing fluid communication between the groove and a vacuum source are provided. Upon evacuation of the volume defined between the groove and the tape, the tape is drawn down into the groove and stretched, thereby increasing the separation or gap between adjacent dice and reducing the risk of damage upon removal of the dice.

15 Claims, 2 Drawing Sheets

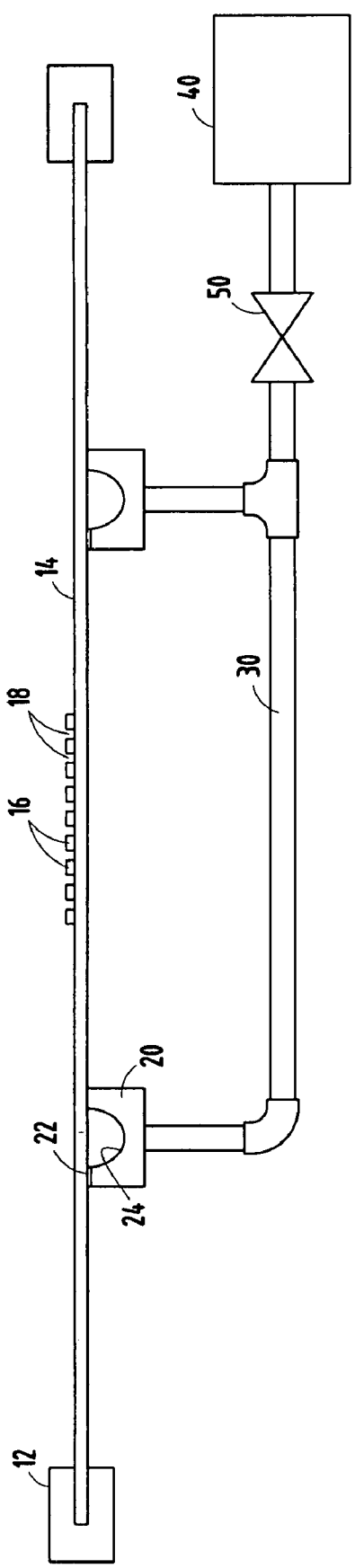
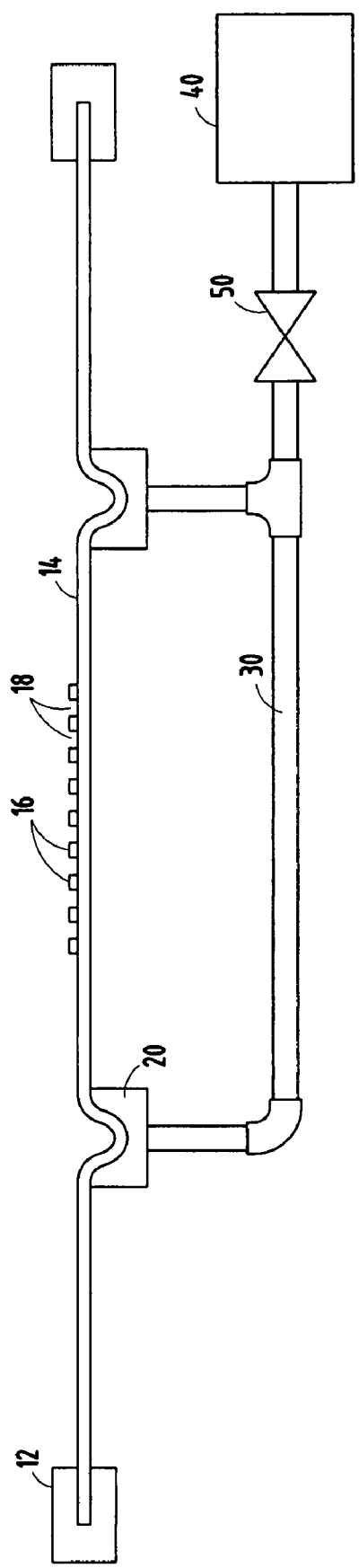

VACUUM EXPANSION OF INTEGRATED CIRCUITS AT SORT

TECHNICAL FIELD

This invention relates to an apparatus and method for separating individual semiconductor devices from a bulk semiconductor substrate.

BACKGROUND OF THE INVENTION

A multitude of semiconductor devices are typically fabricated together on a single substrate or wafer, and subsequently separated or singulated into individual components that are incorporated into an electrical apparatus, sometimes after further processing. Singulation is commonly achieved by placing a wafer on an adhesive-coated polymer tape that is held by a frame, and cutting through the thickness of the wafer without cutting through the tape to separate the individual semiconductor devices from each other. After singulation, it is common to wash the individual semiconductor devices, while they are still attached to the tape, to remove debris generated during the cutting step. Thereafter, the individual semiconductors are removed from the tape, such as with a pick-and-place apparatus, in a die sorting operation.

During a die sorting operation, following singulation and washing, the separated individual components (often referred to as "dice") are removed from the tape using, in combination, a needle thrust or poke from the back of the tape, and a vacuum pick tip or suction collet that engages the die from the other side. This combination lifts and separates the die from the tape. During this operation, alignment of the center points of the needle and pick tip is critical to ensuring that the die being removed from the tape does not contact an adjacent die. As the die is being lifted from the tape, misalignment of the pick tip and needle may cause the die to tilt slightly, frequently up to about eight or nine degrees. Given the typical die clearance, it is possible for the picked die to tilt and contact an adjacent die. This can cause damage to the picked die and/or the adjacent contacted die. Such damage can cause immediate failure or inoperability of the component, or premature failure in normal use.

Accordingly, it would be desirable to provide an apparatus and process for using a conventional pick-and-place apparatus for removing the dice from the tape, without contacting the picked die with an adjacent die during the sorting operation.

SUMMARY OF THE INVENTION

The invention provides a method and apparatus for utilizing a vacuum to stretch a tape carrying a plurality of dice (e.g., individual integrated circuit devices singulated from a common wafer) in order to increase the separation or gap between adjacent dice during a sorting operation in which each of the individual dice are removed from the tape. The apparatus includes a frame for holding edges of a tape carrying a plurality of singulated devices, a vacuum chuck having upper surfaces for continuously contacting an underside of a tape carrying a plurality of singulated devices along a perimeter circumscribing the singulated devices, a groove defined in the upper surface of the vacuum chuck, and conduit for providing fluid communication between the groove and a vacuum source. During removal of the individual dice from the tape, such as by a vacuum pick from the top side of the die and a needle poke from the underside of the die, the volume defined between the groove and the tape is evacuated to draw the tape down into the groove and thereby stretch the tape causing a substantial increase in the separation or gap between adjacent dice.

These and other features, advantages and objects of the present invention will be further understood and appreciated by those skilled in the art by reference to the following specification, claims and appended drawings.

BRIEF DESCRIPTION OF THE DRAWINGS

FIG. 2 is a cross-sectional view of a frame and vacuum expansion and chuck combination in accordance with the invention before a vacuum is drawn in a groove defined in the upper surface of the vacuum expansion chuck.

FIG. 3 is a cross-sectional view of the frame and vacuum expansion chuck combination shown in FIG. 1 after a vacuum has been drawn in the groove defined in the upper surface of the vacuum expansion chuck.

DESCRIPTION OF THE PREFERRED EMBODIMENTS

Figure 1:
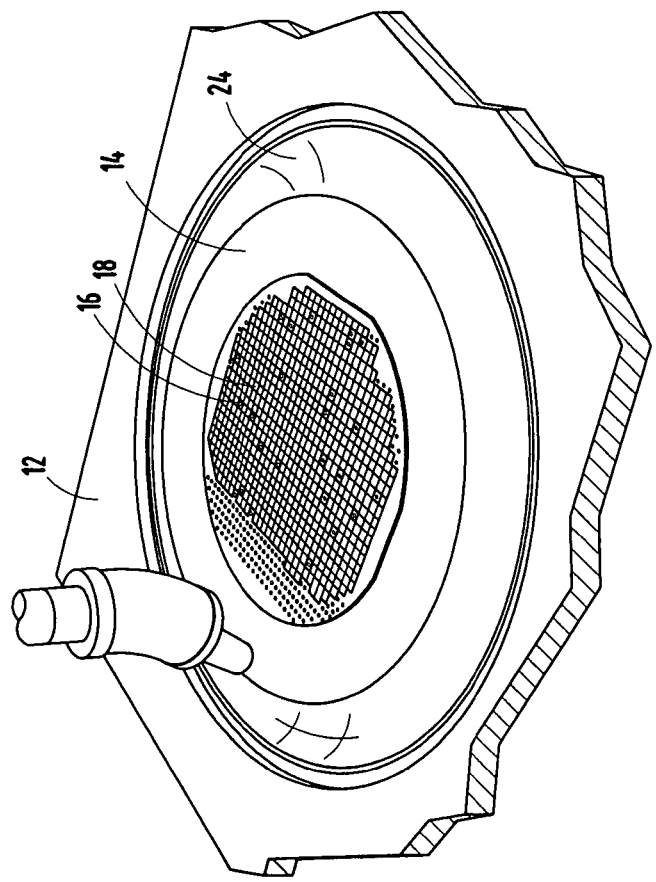
FIG. 1 is a perspective view of an apparatus in accordance with the invention comprising a frame for holding edges of a tape carrying dice, and a vacuum chuck for stretching the tape to increase the separation between adjacent dice.

A perspective view of an apparatus 10 in accordance with the invention is illustrated in FIG. 1. As shown in FIG. 2, apparatus 10 includes a frame 12 which holds the edges of a polymer tape 14 having an adhesive disposed on its upper surface, and carrying a plurality of dice 16 which have been singulated from a single wafer using a saw or other cutting technique to define a separation or gap 18 between the individual dice. FIGS. 2 and 3 only show the cuts in a single direction perpendicular to the drawing sheet. However, it will be appreciated that similar cuts are made along planes parallel with the drawing sheet to form a two-dimensional array of dice.

It will be understood that frame 12 is illustrated schematically, and may comprise any suitable configuration, including clamping devices, that are capable of securely holding edges of tape 14 to maintain tape 14 in a taut, even perhaps slightly pre-stretched, condition during the process of removing dice 16 from tape 14.

Apparatus 10 also includes a vacuum chuck 20, which may have a ring like structure, but which may also have generally any shape defining a continuous loop extending around dice 16, between dice 16 and frame 12. Vacuum chuck 20 has upper surfaces 22 that contact or are capable of contacting tape 14 when a vacuum is drawn on a groove 24 defined in the upper surface of vacuum chuck 20. Illustrated groove 24 has a generally U-shaped configuration. While the U-shaped groove is preferred, other shapes may also be employed, such as a V-shaped groove. It is also conceivable that multiple concentric grooves and/or other groove patterns may also be employed. While the illustrated embodiment includes a single groove that extends continuously along the upper surface of vacuum chuck 20, the objectives of the invention may be achieved employing a plurality of segmented grooves that do not extend continuously around chuck 20.

Conduit 30 provides means for fluid communication between groove 24 and vacuum source 40. At least one valve 50 may be provided to selectively isolate groove 24 from vacuum source 40 and allow fluid communication between groove 24 and the vacuum source to cause tape 14 to be drawn down into groove 24, as shown in FIG. 3. This causes tape 14 to become stretched, whereby gaps defined between adjacent dice 16 are expanded to facilitate removal of the dice from tape 14 with a reduced risk of contacting the dice with each other during removal of a die.

Figure 4:
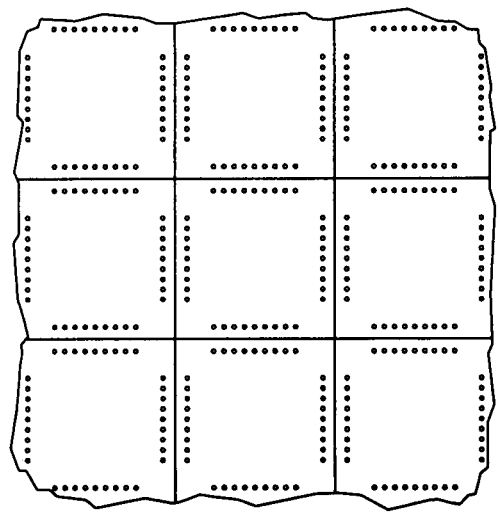
FIG. 4 is a top view of an array of dice carried on a tape prior to drawing a vacuum in the groove of the vacuum expansion chuck shown in FIGS. 1 and 2.
Figure 5:
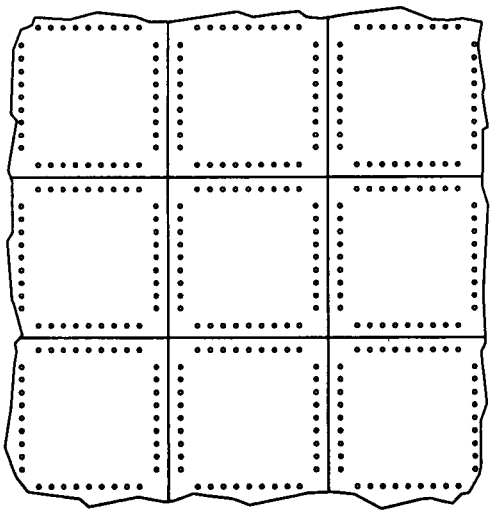
FIG. 5 is a top view of the dice shown in FIG. 1 after a vacuum has been drawn in the groove defined in the upper surface of the vacuum expansion chuck.

As can be seen by comparing FIGS. 2 and 3, evacuation of groove 24 causes a substantial increase in the separation 18 between adjacent dice 16. This is also illustrated in FIGS. 4 and 5 which show the dice 16 and the gaps 18 therebetween before and after a vacuum is drawn on groove 24, respectively. It has been found, that when conventional adhesive tapes are employed, the gap or separation between adjacent dice is increased by about a factor of three. This is an increase in separation that is sufficient to very substantially reduce and/or eliminate contact between adjacent dice during removal of a die when there is the typical small but often troublesome misalignment between a vacuum pick tip used to lift the die from the top and the needle poking at the tape from the underside. Thus, the invention provides a method and apparatus that avoids the need for solving the very difficult problem of maintaining precise alignment between a vacuum pick tip and a needle punch.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A frame and vacuum expansion chuck combination for stretching a tape carrying a plurality of singulated devices to facilitate removal of the devices with reduced risk of contact between a device being removed from the tape and an adjacent device on the tape, comprising:
   a frame for holding edges of a tape carrying a plurality of singulated devices;
   a vacuum chuck having an upper surface for continuously contacting an underside of the tape carrying a plurality of singulated devices along a perimeter circumscribing the singulated devices,
   a groove being defined in the upper surface of the vacuum chuck, said groove disposed to only underlie the tape outside of the perimeter circumscribing the singulated devices; and
   conduit for providing fluid communication between the groove and a vacuum source.

2. The combination of claim 1, wherein the vacuum chuck has a circular ring configuration.

3. The combination of claim 1, wherein the vacuum chuck includes a plurality of discontinuous grooves.

4. The combination of claim 1, wherein the vacuum chuck includes a plurality of concentric grooves.

5. The combination of claim 1, wherein the groove in the vacuum chuck has a U-shaped cross-sectional configuration.

6. An apparatus for stretching a tape carrying a plurality of singulated devices to facilitate removal of the devices with reduced risk of contact between a device being removed from the tape and an adjacent device on the tape, comprising:
   a frame for holding edges of a tape carrying a plurality of singulated devices;
   a vacuum chuck having an upper surface for continuously contacting an underside of the tape carrying a plurality of singulated devices;
   a groove defined in the upper surface of the vacuum chuck, said groove disposed to only underlie the tape outside of a perimeter circumscribing the plurality of singulated devices;
   conduit for providing fluid communication between the groove and a vacuum source; and
   a valve for selectively isolating the groove from the vacuum source and allowing fluid communication between the groove and the vacuum source to cause a tape to be pulled into the groove and stretched, whereby gaps defined between adjacent dice are expanded to facilitate removal of the dice from the tape with a reduced risk of contact between dice during removal of a die.

7. The apparatus of claim 6, wherein the vacuum chuck has a circular ring configuration.

8. The apparatus of claim 6, wherein the vacuum chuck includes a plurality of discontinuous grooves.

9. The apparatus of claim 6, wherein the vacuum chuck includes a plurality of concentric grooves.

10. The apparatus of claim 6, wherein the groove in the vacuum chuck has a U-shaped cross-sectional configuration.

11. A process for stretching a tape carrying a plurality of singulated devices to facilitate removal of the devices with reduced risk of contact between a device being removed from the tape and an adjacent device on the tape, comprising:
   mounting a tape carrying a plurality of singulated devices on a frame;
   positioning a vacuum chuck having an upper surface contacting an underside of the tape carrying the plurality of singulated devices, the vacuum chuck extending along a perimeter circumscribing the singulated devices, a groove defined in the upper surface of the vacuum chuck, said groove disposed to only underlie the tape outside of the perimeter circumscribing the singulated devices;
   providing conduit for fluid communication between the groove and a vacuum source;
   providing the vacuum source to the conduit and the groove to evacuate a volume defined between the groove and the tape, whereby the tape is drawn into the groove and stretched to expand gaps defined between adjacent dice.

12. The process of claim 11, wherein the vacuum chuck has a circular ring configuration.

13. The process of claim 11, wherein the vacuum chuck includes a plurality of discontinuous grooves.

14. The process of claim 11, wherein the vacuum chuck includes a plurality of concentric grooves.

15. The process of claim 11, wherein the groove in the vacuum chuck has a U-shaped cross-sectional configuration.

* * * * *